United States Patent [19]

Nishibayashi et al.

[11] Patent Number: 5,670,796

[45] Date of Patent: Sep. 23, 1997

[54] SEMICONDUCTOR DEVICE CONSISTING OF A SEMICONDUCTOR MATERIAL HAVING A DEEP IMPURITY LEVEL

[75] Inventors: Yoshiki Nishibayashi; Shin-ichi Shikata; Naoji Fujimori, all of Itami; Takeshi Kobayashi, Osaka, all of Japan

[73] Assignee: Sumitomo Electric Industries, Ltd., Japan

[21] Appl. No.: 619,105

[22] Filed: Mar. 20, 1996

Related U.S. Application Data

[63] Continuation of Ser. No. 311,464, Sep. 22, 1994, abandoned.

[30] Foreign Application Priority Data

Sep. 24, 1993 [JP] Japan .................. 5-238577

[51] Int. Cl.⁶ ..................... H01L 31/0312
[52] U.S. Cl. ............... 257/77; 257/28; 257/657
[58] Field of Search ................ 257/20, 24, 28, 257/66, 76, 77, 15, 656, 657

[56] References Cited

U.S. PATENT DOCUMENTS

| | | | |
|---|---|---|---|
| 4,721,535 | 1/1988 | Itoh et al. | 257/77 |
| 4,785,340 | 11/1988 | Nakagawa et al. | 257/28 |
| 4,966,862 | 10/1990 | Edmond | 437/100 |
| 5,055,141 | 10/1991 | Arya et al. | 257/76 |
| 5,173,761 | 12/1992 | Dreifus et al. | 257/66 |
| 5,229,625 | 7/1993 | Suzuki et al. | 257/77 |
| 5,252,840 | 10/1993 | Shiomi et al. | 257/77 |
| 5,254,862 | 10/1993 | Das et al. | 257/77 |
| 5,408,111 | 4/1995 | Nakajima et al. | |

FOREIGN PATENT DOCUMENTS

| | | |
|---|---|---|
| A-0 457 508 | 11/1991 | European Pat. Off. . |
| A-0 585 942 | 3/1994 | European Pat. Off. . |
| A-40 09 837 | 10/1990 | Germany . |
| 4-280622 | 6/1992 | Japan . |
| A-2 258 760 | 2/1993 | United Kingdom . |

OTHER PUBLICATIONS

Patent Abstracts of Japan, vol. 15, No. 82 of JP-A-02 299273, published Dec. 11, 1990.

Shiomi et al., "High-Voltage Schottky Diodes on Boron-Doped Diamond Epitaxial Films", Japanese Journal of Applied Physics, vol. 29, No. 12 (Dec. 1, 1990), pp. L2163-L2164.

Kobayashi et al., "Analytical studies on multiple delta doping in diamond thin films for efficient hole excitation and conductivity enhancement", Journal of Applied Physics, vol. 76, No. 3 (Aug. 1, 1994), pp. 1977-1979.

*Primary Examiner*—Sara W. Crane
*Attorney, Agent, or Firm*—Pennie & Edmonds LLP

[57] ABSTRACT

A semiconductor device has a structure in which doped layers and undoped layers are alternately stacked and is constituted by (a) a semi-insulating substrate, (b) undoped layers consisting of a substantially undoped diamond material, and (c) thin doped layers formed between the undoped layers and consisting of a diamond material doped with B as an impurity. Stable operation characteristics can be obtained within a temperature range from room temperature to a high temperature while a semiconductor material having a deep impurity level is used.

6 Claims, 11 Drawing Sheets

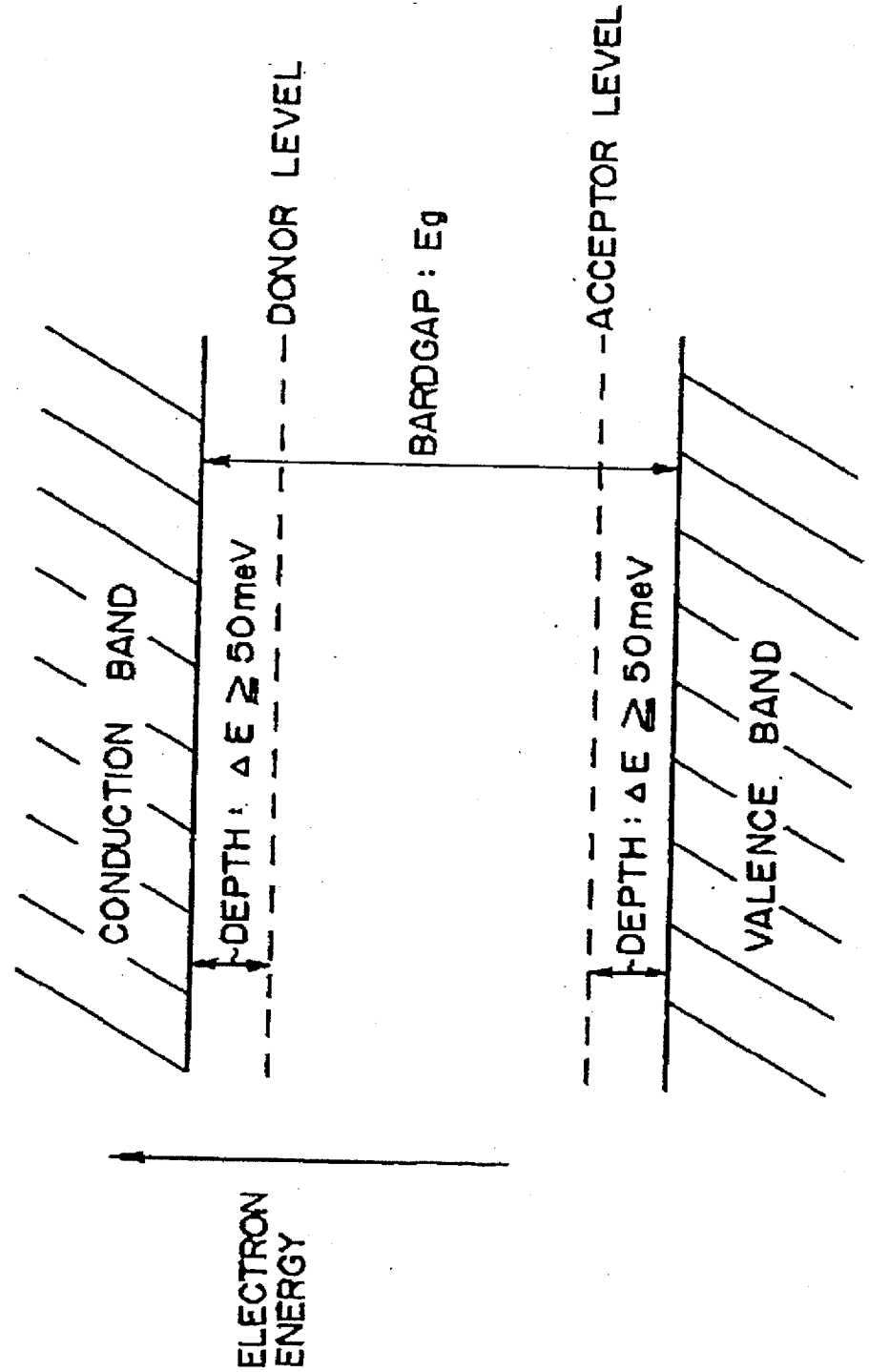

SEMICONDUCTOR DEVICE CONSISTING OF A SEMICONDUCTOR MATERIAL HAVING A DEEP IMPURITY LEVEL

This is a continuation of application Ser. No. 08/311,464, filed Sep. 22, 1994, now abandoned.

BACKGROUND OF THE INVENTION

1. Field of the Invention

The present invention relates to a semiconductor device mainly consisting of a semiconductor material having a deep impurity level and, more particularly, to a semiconductor device which has a deep impurity level and stably operates within a wide temperature range from room temperature to a high temperature.

2. Related Background Art

Conventionally, Si, GaAs, and the like are mainly used as materials constituting semiconductor devices. In recent years, however, materials (to be referred to as wide bandgap materials hereinafter) having larger bandgaps than those of the conventional materials have received a great deal of attention as promising materials for realizing a semiconductor device having high performance and an excellent environmental tolerance, and extensive studies have been made for actual utilization. There are, e.g., ZnSe used for a blue light-emitting device, SiC and diamond capable of realizing a heat-resistant device, and the like.

However, a donor level and an acceptor level (to be generically referred to as an impurity level hereinafter) of these materials are largely apart from a conduction band and a valence band toward a forbidden band side (this distance will be referred to as a depth hereinafter), respectively. For this reason, it is difficult to manufacture devices such as transistors which effectively use the advantage of a wide bandgap material, and studies and experiments have been currently continued. For example, an experiment for a diamond semiconductor having a large bandgap value of 5.5 eV is disclosed in Japanese Patent Laid-Open No. 4-280622.

A carrier concentration in a semiconductor doped with an impurity (dopant) is proportional to $\exp(-\Delta E/kT)$ or $\exp(-\Delta E/2kT)$ where $\Delta E$ represents the depth of the impurity level. When B as a p-type impurity is doped in Si, the depth of the impurity level is 0.045 eV. When P, As, or Sb as an n-type impurity is doped in Si, the depth of the impurity level is 0.045 eV, 0.049 eV, or 0.039 eV. The value of kT is about 0.025 eV at room temperature (300 K.) or about 0.050 eV at 600 K. Therefore, a change of carrier concentration within this temperature range do not exceed 10 times.

However, when a semiconductor having a large bandgap is doped with an impurity, the impurity level is deep, i.e., the value of $\Delta E$ is large, so the dependency of the carrier concentration on temperature becomes large. If $\Delta E = 0.37$ eV, the change of the carrier concentration reaches 1,000 times at the change of a temperature of 300 K. to 600 K. Therefore, the electrical operation characteristics of a semiconductor device using this semiconductor largely change in accordance with an operation temperature, and desired operation characteristics are obtained within only a narrow operation temperature range.

SUMMARY OF THE INVENTION

It is an object of the present invention to provide a semiconductor device which has stable operation characteristics within a temperature range from room temperature to a high temperature while using a semiconductor material having a deep impurity level.

The first semiconductor device of the present invention comprises (a) a first undoped layer consisting of a diamond semiconductor material and substantially non-doped, (b) a first doped layer formed on one surface of the first undoped layer, consisting of the diamond semiconductor material, doped with an impurity, and having a thickness of 3 nm or less, and (c) a second undoped layer formed on a surface of the first doped layer on an opposite side to the first undoped layer, consisting of the diamond semiconductor material, and substantially non-doped.

The first semiconductor device can have a structure in which the undoped layers and the doped layers are alternately stacked, and a top layer and a bottom layer are the undoped layers. The impurity doped in the doped layer is preferably B or N. The second semiconductor device of the present invention comprises (a) a first substantially undoped layer, which consists of a semiconductor material but not diamond, a bandgap value of which is larger than 1.43 Ev, wherein a donor level at least 50 mev less than the edge of the conduction band is obtained when an n-type impurity is doped into the material of the first undoped layer, and wherein an acceptor level at least 50 mev less than the edge of the valence band is obtained when a p-type impurity is doped into the material of the first undoped layer, formed on one surface of the first undoped layer, consisting of the semiconductor material, and doped with an impurity, and (c) a second undoped layer formed on a surface of the first doped layer on an opposite side to the first undoped layer, consisting of the semiconductor material, and substantially non-doped.

The second semiconductor device can have a structure in which the undoped layers and the doped layers are alternately stacked, and a top layer and a bottom layer are the undoped layers. SiC may be used as the semiconductor material and Al or N may be used as the impurity doped in the doped layer. AlN or GaN may be used as the semiconductor material.

In the first semiconductor device of the present invention, the impurity-doped layer consisting of the diamond semiconductor material and having a thickness of 3 nm or less is formed between the undoped layers consisting of the diamond material and substantially undoped. Since the thickness of the doped layer is as small as 3 nm or less, a carrier concentration gradient occurs. Despite the deep impurity level, carriers are diffused from the doped layer to the undoped layers. In an alone doped layer, the carrier activation rate is small at room temperature. However, when the doped layer is combined with the undoped layers, the carrier activation rate increases even at room temperature, and at the same time, the dependency of the carrier activation rate on temperature is reduced. In addition, by alternately stacking the doped layers and the undoped layers, the thickness of a so-called channel layer having active carriers can be adjusted. When the thickness of the channel layer and the concentration of an impurity to be doped are adjusted, the operation characteristics can be easily controlled upon, e.g., applying an electric field.

In the second semiconductor device of the present invention, a wide bandgap material except for a diamond semiconductor material is used, and the thin impurity-doped layer is formed between the undoped layers substantially non-doped as in the semiconductor device consisting of a diamond semiconductor material. As in the semiconductor device using the diamond semiconductor material, also in the second semiconductor device, the carrier concentration gradient occurs. Despite the deep impurity level, the carriers are diffused from the doped layer to the undoped layers. In an alone doped layer, the carrier activation rate is small at room temperature. However, when the doped layer is combined with the undoped layers, the carrier activation rate increases even at room temperature, and at the same time, the dependency of the carrier activation rate on temperature is reduced. In addition, by alternately stacking the doped layers and the undoped layers, the thickness of the so-called channel layer having active carriers can be adjusted. When the thickness of the channel layer and the concentration of an impurity to be doped are adjusted, the operation characteristics can be easily controlled upon, e.g., applying an electric field.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 11 shows donor/acceptor levels after doping.

DESCRIPTION OF THE PREFERRED EMBODIMENTS

An embodiment of the present invention will be described below with reference to the accompanying drawings.
(First Embodiment)

Figure 1:
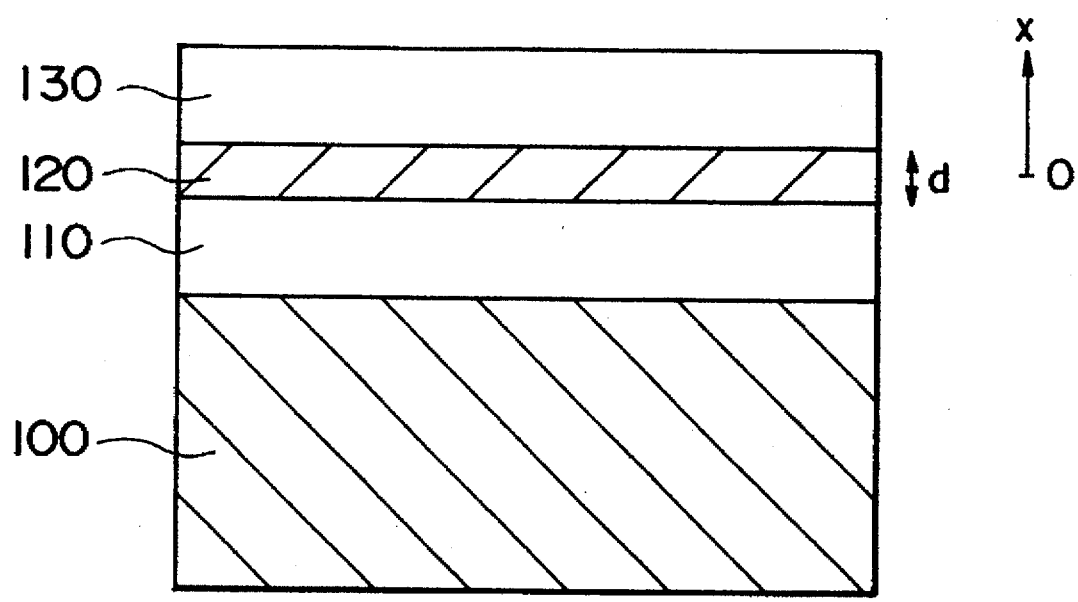
FIG. 1 is a sectional view showing the structure of a semiconductor device according to the first embodiment of the present invention.

FIG. 1 is a sectional view showing the structure of a semiconductor device according to the first embodiment of the present invention. As shown in FIG. 1, this semiconductor device is constituted by (a) a semi-insulating substrate 100, (b) an undoped layer 110 formed on the substrate 100 and consisting of a substantially undoped diamond semiconductor material, (c) a doped layer formed on the undoped layer 110 and consisting of a diamond semiconductor material doped with B as an impurity, and (d) an undoped layer 130 formed on the doped layer 120 and consisting of the substantially undoped diamond semiconductor material. The semiconductor device of this embodiment, which has one doped layer, will also be referred to as an SDD hereinafter.

As for the semiconductor device in FIG. 1, the present inventor checked the density and the excitation rate of holes serving as carriers. As parameters, an impurity doping concentration ($N_A$) in the doped layer, a thickness (d) of the doped layer, and a temperature (T) were used. In this case, simulation was performed by a computer using a basic equation, e.g., Poisson's equation, and assuming that a bandgap (Eg)=5.5 eV, a dielectric constant ($\epsilon$)=5.7 $\epsilon_0$ ($\epsilon_0$ represents the dielectric constant in the vacuum), an effective mass (m) of holes=0.75 $m_0$ ($m_0$ represents the mass of free electrons in the vacuum), and a depth of the impurity level=0.3 eV.

Figure 2:
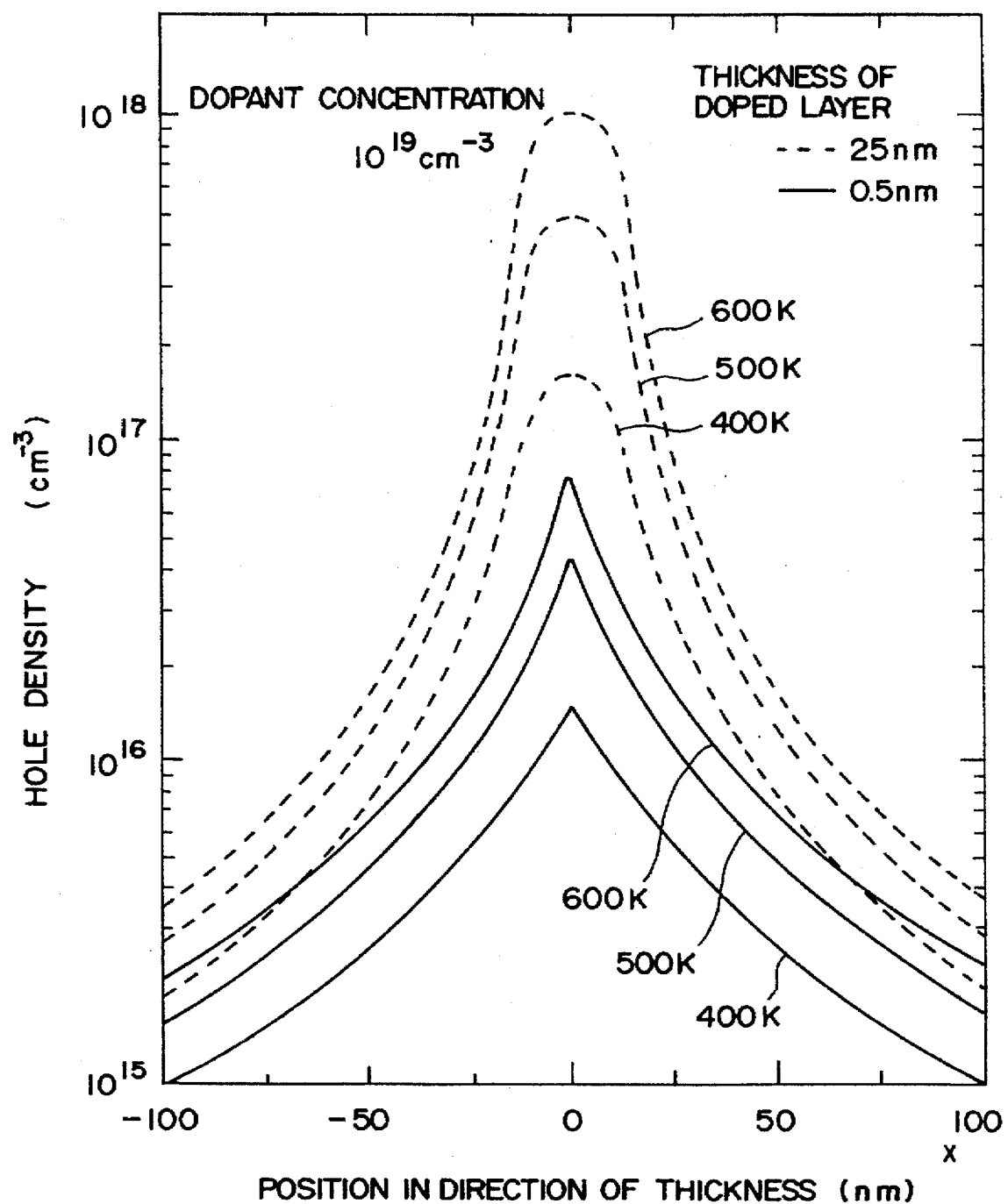
FIG. 2 is a graph showing the distribution of a hole density in the first embodiment.

FIG. 2 is a graph showing the distribution of the hole density when the impurity doping concentration ($N_A$) is $10^{19}$ $cm^{-3}$. Referring to FIG. 2, solid lines represent a hole density when the thickness (d) of the doped layer is 0.5 nm, and broken lines represent a hole density when the thickness (d) of the doped layer is 25 nm. It is found that, as the doped layer becomes thinner, the holes are effectively excited in the undoped diamond layers other than the doped layer.

Figure 3:
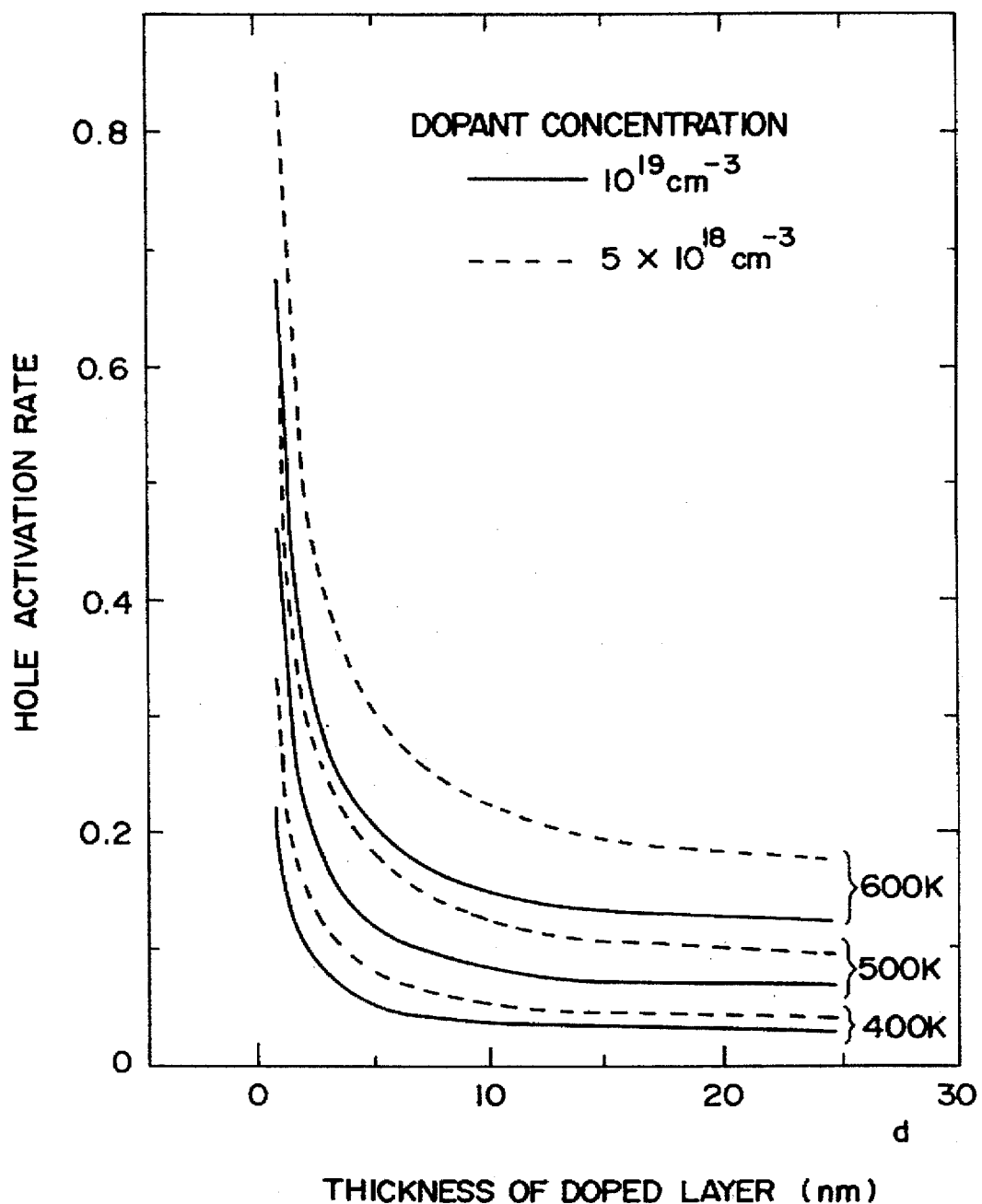
FIG. 3 is a graph showing the dependency of a hole excitation rate on the thickness of a doped layer in the first embodiment.

FIG. 3 is a graph showing the dependency of a hole excitation rate on the thickness (d) of the doped layer when the impurity doping concentration ($N_A$) is $10^{19}$ $cm^{-3}$ or $5 \times 10^{18}$ $cm^{-3}$. As shown in FIG. 3, it is confirmed that the hole excitation rate abruptly increases at the thickness (d) of the doped layer of 3 nm or less.

Figure 4:
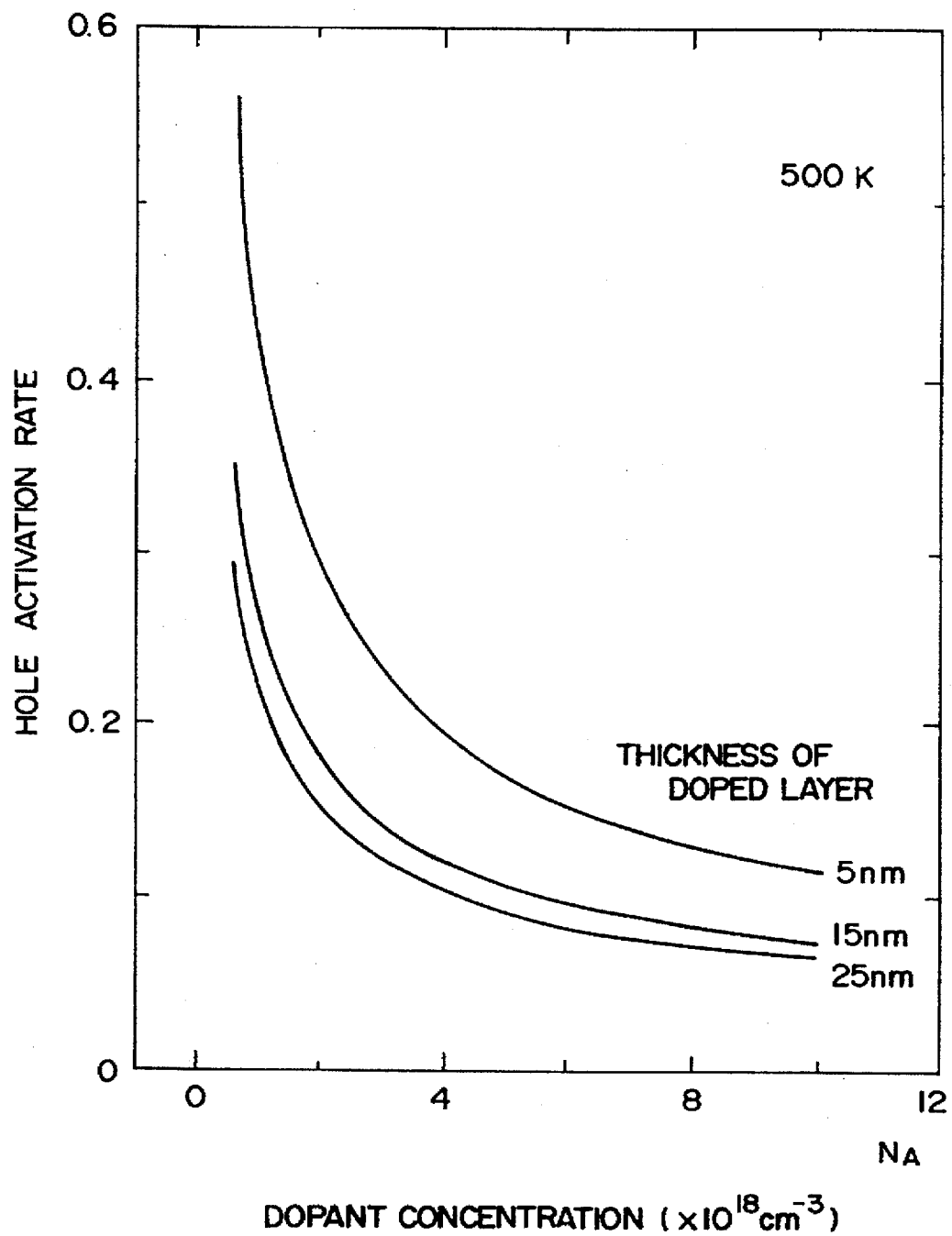
FIG. 4 is a graph showing the dependency of the hole excitation rate on an impurity doping concentration in the first embodiment.

FIG. 4 is a graph showing the dependency of the hole excitation rate on the impurity doping concentration ($N_A$) when the temperature (T)=500 K., and the thickness (d) of the doped layer=25 nm, 15 nm, or 5 nm. As shown in FIG. 4, it is confirmed that the hole excitation rate abruptly increases at the impurity doping concentration ($N_A$) of $2 \times 10^{18}$ $cm^{-3}$ or less.
(Second Embodiment)

Figure 5:
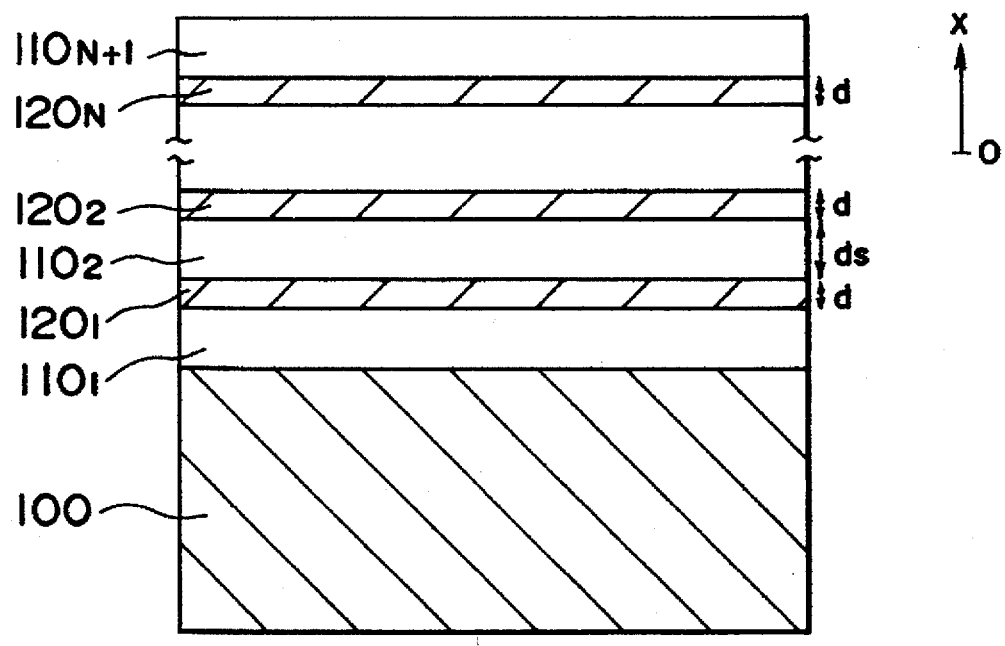
FIG. 5 is a sectional view showing the structure of a semiconductor device according to the second embodiment of the present invention.

FIG. 5 is a sectional view showing the structure of a semiconductor device according to the second embodiment of the present invention. This semiconductor device (to be also referred to as an MDD hereinafter) has a structure in which doped layers and undoped layers are alternately stacked. As shown in FIG. 5, this semiconductor device is constituted by (a) a semi-insulating substrate 100, (b) undoped layers $110_1$ to $110_{N+1}$ consisting of a substantially undoped diamond semiconductor material, and (c) doped layers $120_1$ to $120_N$ formed between the undoped layers $110_1$ to $110_{N+1}$ and consisting of a diamond semiconductor material doped with B as an impurity.

As for the semiconductor device in FIG. 5, the present inventor checked the density of holes serving as carriers and a sheet conductance. As parameters, an impurity doping concentration ($N_A$) in the doped layer, a thickness (d) of the doped layer, a temperature (T), a distance ($d_s$) between the doped layers, and a number (N) of doped layers were used. In this case, in addition to the conditions in the first embodiment, assuming that a mobility in the doped layer=20 $cm^2/V \cdot s$, and a mobility in the undoped layer=400$(T/300)^{1.5}$ $cm^2/V \cdot s$ (T represents an absolute temperature), simulation was performed by a computer.

Figure 6:
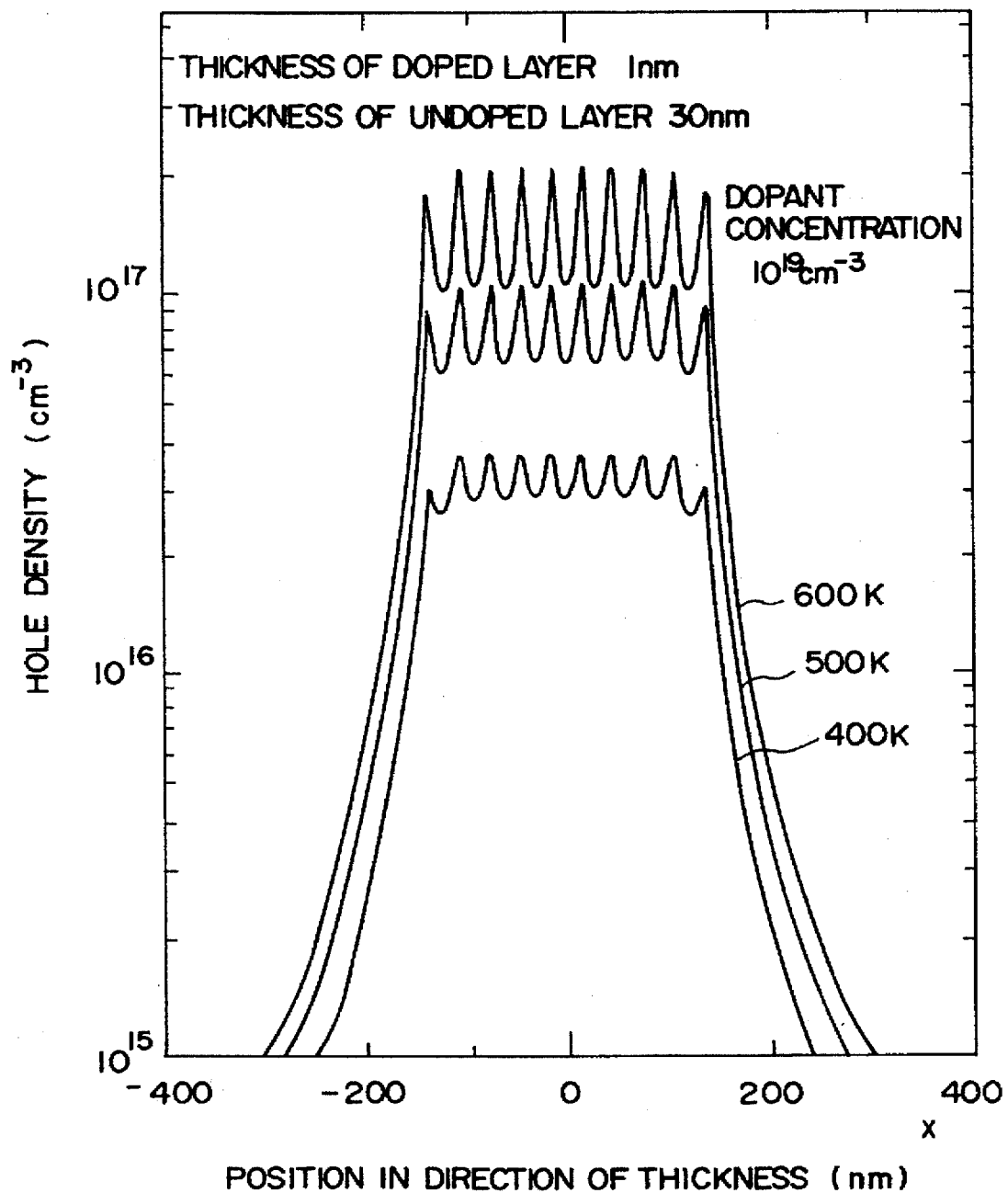
FIG. 6 is a graph showing the distribution of a hole density in the second embodiment.

FIG. 6 is a graph showing the distribution of a hole density when the thickness (d) of the doped layer=1 nm, the impurity doping concentration $(N_A)=10^{19}$ $cm^{-3}$, the distance $(d_s)$ between the doped layers=30 nm, the number (N) of doped layers=10, and the temperature (T)=400 K., 500 K., or 600 K. As shown in FIG. 6, it is confirmed that the hole density which increases almost by 10 times as in the first embodiment is distributed throughout the doped and undoped layers. It is also confirmed that the dependency of the hole density on temperature is improved as in the first embodiment.

Figure 7:
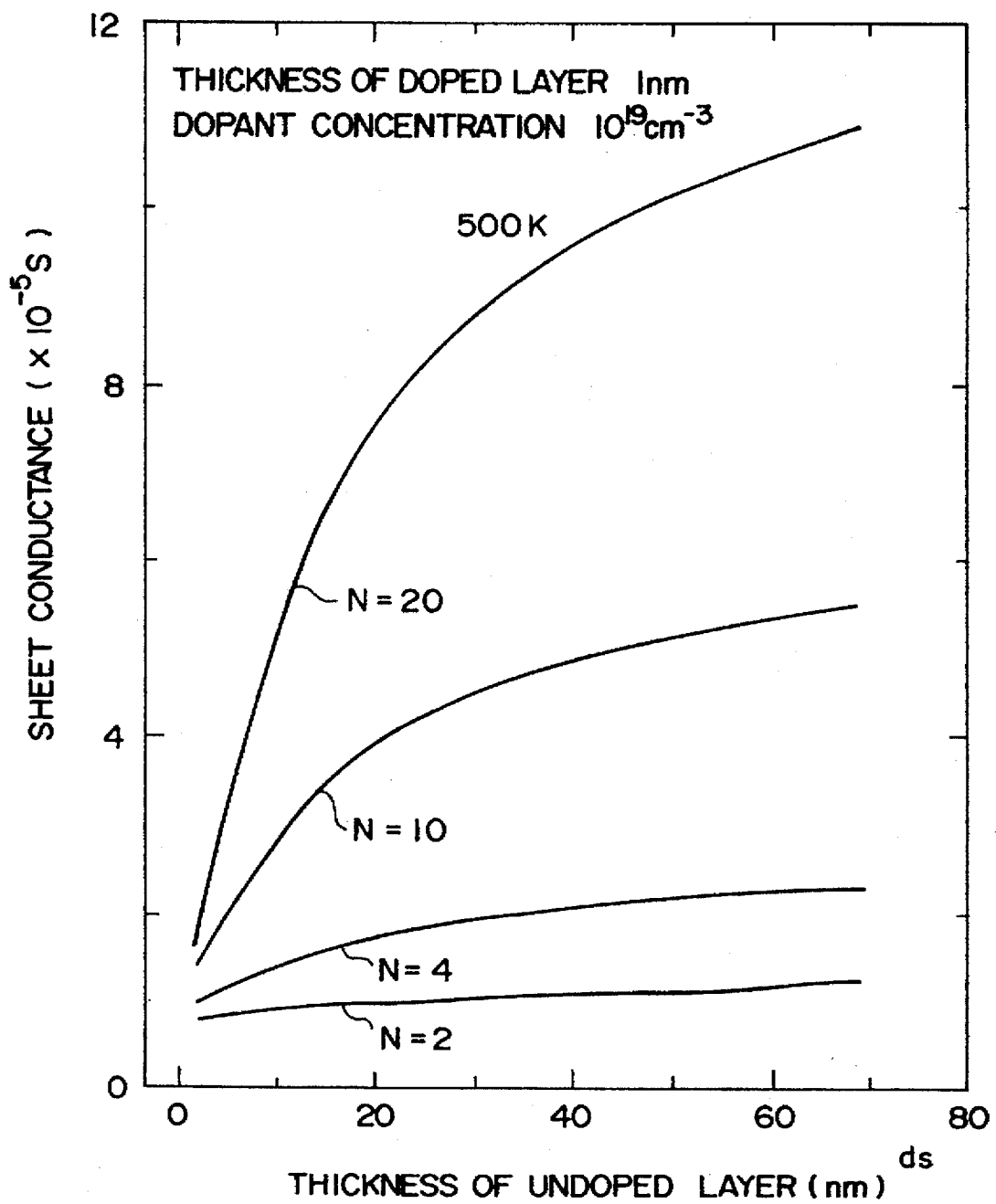
FIG. 7 is a graph showing the dependency of a sheet conductance on a distance between doped layers or the number of doped layers in the second embodiment.

FIG. 7 is a graph showing the dependency of a sheet conductance (G) on the distance $(d_s)$ between the doped layers or the number (N) of doped layers when the impurity doping concentration $(N_A)$ in the doped layer=$10^{19}$ $cm^{-3}$, the thickness (d) of the doped layer=0.5 nm, and the temperature (T)=500 K. As shown in FIG. 7, it is confirmed that, when the distance $(d_s)$ between the doped layers is constant, and the number (N) of doped layers increases, the sheet conductance increases. In addition, when the number (N) of doped layers is constant, and the distance $(d_s)$ between the doped layers is at least 70 nm or less, the sheet conductance represents a monotone increasing function with respect to the distance $(d_s)$ between the doped layers.

(Third Embodiment)

Figure 8A:
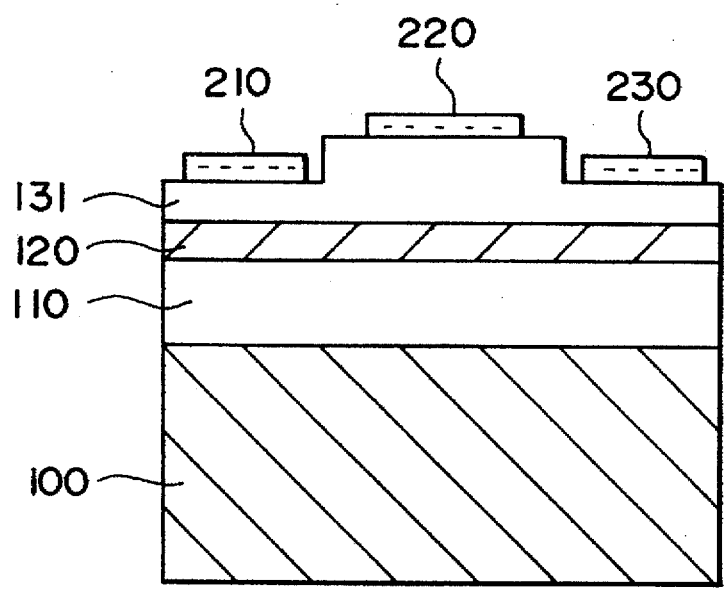
FIGS. 8A and 8B are sectional views showing the structures of semiconductor devices according to the third embodiment of the present invention.
Figure 8B:
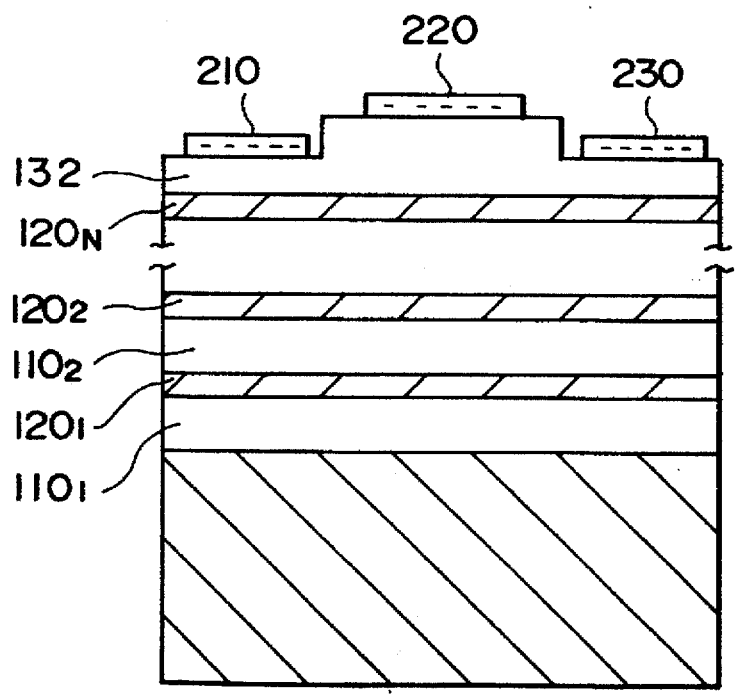

FIGS. 8A and 8B are sectional views showing the structures of semiconductor devices according to the third embodiment of the present invention. In each semiconductor device of this embodiment, a field effect transistor (FET) is constituted using the semiconductor device of the first or second embodiment. The semiconductor device in FIG. 8A has a structure in which a source electrode 210, a gate electrode 220, and a drain electrode 230 are formed on an undoped layer 131 using the semiconductor device of the first embodiment. The semiconductor device in FIG. 8B has a structure in which a source electrode 210, a gate electrode 220, and a drain electrode 230 are formed on an undoped layer 132 using the semiconductor device of the second embodiment.

As for the semiconductor devices in FIGS. 8A and 8B, the present inventor checked a sheet conductance (G) and a channel conductance (Gm). As parameters, an impurity doping concentration $(N_A)$ in the doped layer, a thickness (d) of the doped layer, a temperature (T), a distance $(d_s)$ between the doped layers, and a number (N) of doped layers were used. In addition to the conditions in the second embodiment, assuming that the channel has a normalized size with a length of 1 cm and a width of 1 cm, simulation was performed by a computer.

Figure 9:
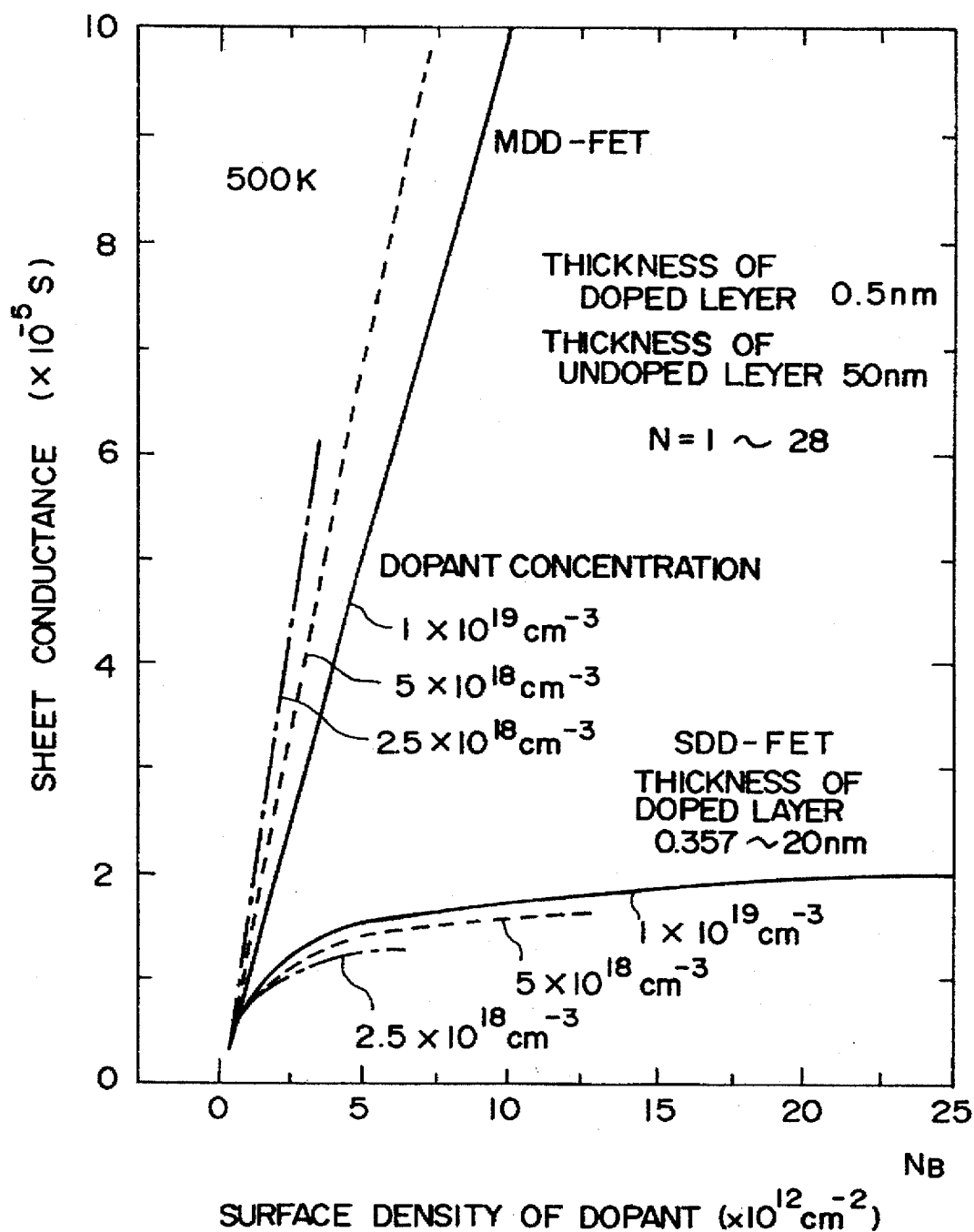
FIG. 9 is a graph showing the dependency of a sheet conductance on a surface impurity concentration in the third embodiment.

FIG. 9 is a graph showing the dependency of the sheet conductance (G) of the SDD or MDD on a surface impurity concentration $(N_B)$ when the impurity doping concentration $(N_A)$ in the doped layer=$2.5 \times 10^{18}$ $cm^{-3}$, $5 \times 10^{18}$ $cm^{-33}$, or $10^{19}$ $cm^{-3}$, and the temperature (T)=500 K. As shown in FIG. 9, in the SDD, the sheet conductance (G) of 1 to $2 \times 10^{-5}$ S can be realized within a wide range of the surface impurity concentration $(N_B)$. In the MDD, a much larger value of the sheet conductance (G) than that of the SDD can be realized when the surface impurity concentration $(N_B)$ is left unchanged. Therefore, it is confirmed that the value of the sheet conductance (G) can be increased by 10 times or more as compared to a conventional FET consisting of a diamond semiconductor material and having the sheet conductance (G) of several μS.

Figure 10:
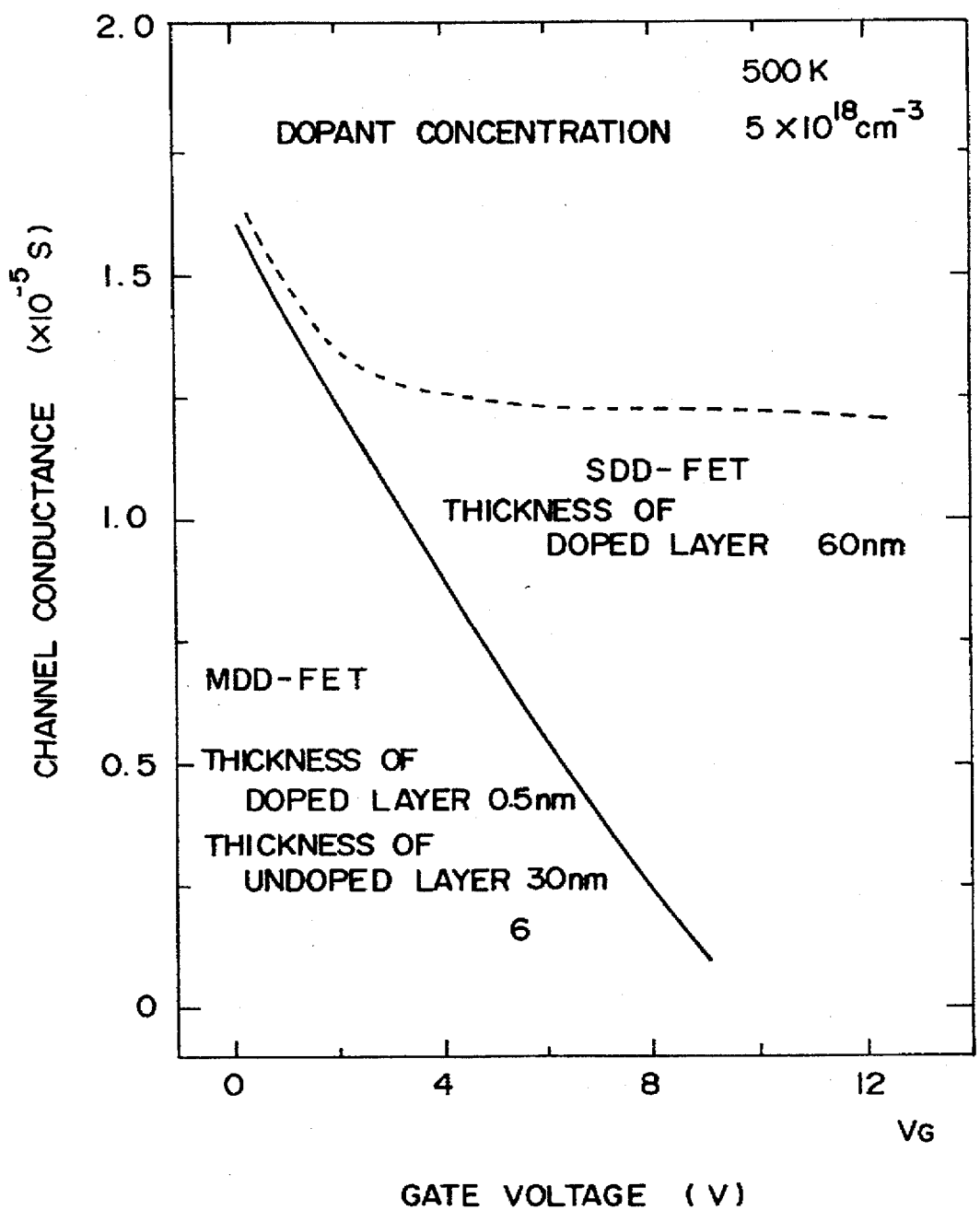
FIG. 10 is a graph showing the dependency of a channel conductance on a gate voltage in the third embodiment.

FIG. 10 is a graph showing the dependency of a channel conductance (Gin) of the SDD or MDD on a gate voltage $(V_D)$ when the impurity doping concentration $(N_A)$ in the doped layer=$5 \times 10^{18}$ $cm^{-3}$, and the temperature (T)=500 K. As shown in FIG. 10, the channel conductance (Gm) of the SDD can be adjusted within a range of about 1.7 times by the value of the gate voltage $(V_G)$ in the conditions shown in FIG. 10. The channel conductance (Gin) of the MDD can be adjusted within a range of about 17 times by the value of the gate voltage $(V_G)$ in the conditions shown in FIG. 10.

The present invention is not limited to the above embodiments, and various changes and modifications can be made. For example, in the above embodiments, B is used as an impurity doped in the diamond semiconductor. However, N can also be used as an impurity to obtain the same effect as described above although the conductivity type is changed. In the above embodiments, the diamond semiconductor is used. However, SiC, AlN, or GaN can also be used as a main material. An impurity to be doped is selected in accordance with the main material. When SiC is used as the main material, Al or N can be used. In addition to FETs, electronic devices such as p-n diodes, pnp or npn transistors, thyristors and the like can also be constituted using the semiconductor device of the present invention.

As has been described above in detail, the semiconductor device of the present invention consists of a semiconductor material having a large bandgap and an impurity level deeper than that of the conventional Si or GaAs. The semiconductor device is constituted such that the substantially undoped layers are formed to sandwich therebetween the thin doped layers doped with an impurity at a concentration not to cause degeneration of the impurity level. With this structure, carrier diffusion occurs due to the carrier concentration gradient from the doped layers to the substantially undoped layers. For this reason, the carrier activation rate increases, and a stable operative state can be obtained within a temperature range from room temperature to about 600° C. Therefore, a semiconductor device which has stable operation characteristics within a wide temperature range from room temperature to a high temperature and can properly control the carrier concentration can be realized using the semiconductor material having a deep impurity level. By using this semiconductor device, p-n diodes, pnp or npn transistors, thyristors, field effect transistors, and the like, which have a wide bandgap and used as, e.g., electronic devices having a high heat resistance, or light-emitting elements for blue light or ultraviolet ray can be realized.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.238577/1993 filed on Sep. 24, 1993 is hereby incorporated by reference.

What is claimed is:

1. A semiconductor device comprising
   (a) a multi-layer structure including:
      N+1 layers of undoped diamond, each of which has a thickness of not less than 30 nm; and
      N layers of doped diamond, each of which has a thickness of not more than 3 nm, wherein N is an integer of 1 or larger, wherein said layers of doped diamond are stacked alternately with said layers of undoped diamond, and wherein the top layer and bottom layer of said multi-layer structure are said layer of undoped diamond, and
   (b) an electrode disposed on the topper of said multi-layer structure.

2. A semiconductor device according to claim 1, wherein N is selected from 1 to 20.

3. A semiconductor device according to claim 1, wherein N equals 1.

4. A semiconductor device according to claim 1, wherein each of said layers of doped diamond includes boron atoms or nitrogen atoms as an impurity.

5. A semiconductor device according to claim 1, wherein each of said layers of undoped diamond has a thickness of not more than 50 nm.

6. A semiconductor device comprising (a) a multi-layer structure including:

N+1 layers of undoped diamond, each of which has a thickness of not less than 30 nm; and N layers of doped diamond, each of which has a thickness of not more than 3 nm, wherein N is an integer of 10 to 20, wherein said layers of doped diamond are stacked alternately with said layers of undoped diamond, and wherein the top layer and the bottom layer of said multi-layer structure are said layer of undoped diamond, and (b) an electrode disposed on the top layer of said multi-layer structure.

* * * * *

UNITED STATES PATENT AND TRADEMARK OFFICE
CERTIFICATE OF CORRECTION

PATENT NO. : 5,670,796

DATED : September 23, 1997

INVENTOR(S) : Yoshiki NISHIBAYASHI, Shin-ichi SHIKATA, Naoji FUJIMORI, Takeshi KOBAYASHI It is certified that error appears in the above-identified patent and that said Letters Patent is hereby corrected as shown below:

On the title page of the Patent, item [73], Assignee: add "Takeshi Kobayashi of Japan."

Signed and Sealed this

Thirteenth Day of July, 1999

Attest:

Q. TODD DICKINSON

Attesting Officer

Acting Commissioner of Patents and Trademarks